US012573810B2

(12) United States Patent
Lee

(10) Patent No.: US 12,573,810 B2
(45) Date of Patent: Mar. 10, 2026

(54) BONDING STRUCTURE

(71) Applicant: Teknologian tutkimuskeskus VTT Oy,
Espoo (FI)

(72) Inventor: Jae-Wung Lee, Espoo (FI)

(73) Assignee: Teknologian tutkimuskeskus VTT Oy,
Espoo (FI)

( * ) Notice: Subject to any disclaimer, the term of this
patent is extended or adjusted under 35
U.S.C. 154(b) by 51 days.

(21) Appl. No.: 18/576,748

(22) PCT Filed: Jun. 30, 2022

(86) PCT No.: PCT/FI2022/050481

§ 371 (c)(1),
(2) Date: Jan. 5, 2024

(87) PCT Pub. No.: WO2023/281161

PCT Pub. Date: Jan. 12, 2023

(65) Prior Publication Data

US 2025/0006684 A1 Jan. 2, 2025

(30) Foreign Application Priority Data

Jul. 6, 2021 (FI) ..................................... 20215791

(51) Int. Cl.
*H01L 23/00* (2006.01)
*H01S 5/0237* (2021.01)
*H10W 90/00* (2026.01)
*H10W 72/00* (2026.01)
*H10W 72/20* (2026.01)
*H10W 80/00* (2026.01)

(52) U.S. Cl.
CPC ........... *H01S 5/0237* (2021.01); *H10W 90/00*
(2026.01); *H10W 90/701* (2026.01); *H10W
72/07252* (2026.01); *H10W 72/07253*
(2026.01); *H10W 72/07255* (2026.01); *H10W
72/221* (2026.01); *H10W 72/232* (2026.01);
*H10W 72/2524* (2026.01); *H10W 80/721*
(2026.01); *H10W 90/725* (2026.01); *H10W
90/794* (2026.01)

(58) Field of Classification Search
CPC ....... H01L 24/16; H01L 24/08; H01L 25/167;
H01L 23/49811
See application file for complete search history.

(56) References Cited

U.S. PATENT DOCUMENTS 5,488,504 A * 1/1996 Worchesky ............. G02F 1/218
359/248
5,667,132 A * 9/1997 Chirovsky .............. H01L 24/10
257/E21.705

(Continued)

*Primary Examiner* — Nathan W Ha
(74) *Attorney, Agent, or Firm* — Laine IP Oy

(57) ABSTRACT

According to an example aspect of the present invention,
there is provided a bonding structure for forming at least one
electrical connection between an optoelectronic component
and a photonic substrate. The bonding structure comprises a
pillar structure between the optoelectronic component and
the photonic substrate, and a bonding layer comprising
bonding material on the pillar structure. The pillar structure
for at least one individual electrical connection comprises at
least two portions and at least one gap between the portions
for receiving extra bonding material of the bonding layer.

16 Claims, 4 Drawing Sheets

(56)                References Cited

U.S. PATENT DOCUMENTS

| | | | | |
|---|---|---|---|---|
| 6,506,633 | B1 * | 1/2003 | Cheng | H01L 24/82 |
| | | | | 257/E21.705 |
| 10,598,874 | B2 * | 3/2020 | Aoki | H01L 24/81 |
| 11,251,071 | B2 * | 2/2022 | Yu | H01L 21/4853 |
| 11,276,661 | B2 * | 3/2022 | Fang | H01L 24/19 |
| 11,961,800 | B2 * | 4/2024 | Yu | H01L 21/76843 |
| 12,368,116 | B2 * | 7/2025 | Kao | G02B 6/13 |
| 2005/0167830 | A1 * | 8/2005 | Chang | H05K 3/4007 |
| | | | | 257/737 |
| 2006/0279000 | A1 * | 12/2006 | Chang | H01L 23/49816 |
| | | | | 257/E21.508 |
| 2008/0083993 | A1 * | 4/2008 | Zeng | H01L 24/13 |
| | | | | 257/E23.141 |
| 2009/0079094 | A1 | 3/2009 | Lin | |
| 2009/0175307 | A1 * | 7/2009 | Ryu | H10F 71/127 |
| | | | | 372/50.21 |
| 2011/0074026 | A1 * | 3/2011 | Shim | H01L 21/50 |
| | | | | 257/737 |

| | | | | |
|---|---|---|---|---|
| 2012/0032337 | A1 * | 2/2012 | Lu | H01L 21/4853 |
| | | | | 257/E23.06 |
| 2012/0305633 | A1 * | 12/2012 | Feger | B23K 1/0016 |
| | | | | 228/203 |
| 2014/0269804 | A1 * | 9/2014 | Lai | G02B 6/4206 |
| | | | | 372/50.21 |
| 2014/0332820 | A1 | 11/2014 | Han et al. | |
| 2017/0253478 | A1 * | 9/2017 | Ghyselen | B81B 7/0025 |
| 2018/0062025 | A1 * | 3/2018 | Muramoto | H01L 24/94 |
| 2018/0090408 | A1 * | 3/2018 | Tsai | H01L 23/49827 |
| 2019/0131266 | A1 * | 5/2019 | Aoki | G02B 6/13 |
| 2019/0341744 | A1 | 11/2019 | Chae | |
| 2020/0150361 | A1 * | 5/2020 | Aoki | G02B 6/4214 |
| 2021/0018360 | A1 * | 1/2021 | You | H01L 25/167 |
| 2021/0366864 | A1 * | 11/2021 | Fang | H01L 23/5384 |
| 2022/0367334 | A1 * | 11/2022 | Huang | H01L 21/4857 |
| 2023/0006114 | A1 * | 1/2023 | Wu | G02B 6/30 |
| 2025/0022810 | A1 * | 1/2025 | Chen | H01L 21/4857 |

* cited by examiner

100

102

105

104     103 106

107

101

BONDING STRUCTURE

FIELD

The present invention relates to bonding structures between a substrate and an electronic component, especially bonding structures between an optoelectronic component, such as a vertical-cavity surface-emitting laser (VCSEL) chip, and a silicon photonics substrate.

BACKGROUND

Flip chip bonding is a method for interconnecting semiconductor devices, such as integrated circuit (IC) chips and microelectromechanical systems (MEMS), to external circuitry with solder bumps that have been deposited onto the chip pads. The solder bumps are deposited on the chip pads on the top side of the wafer during the final wafer processing step. In order to mount the chip to external circuitry (e.g. a circuit board or another chip or wafer), it is flipped over so that its top side faces down, and aligned so that its pads align with matching pads on the external circuit, and then the solder is reflowed to complete the interconnect.

Flip chip bonding can be used for bonding VCSEL chip onto silicon (Si) photonics substrate. Good soldering centers the optical axis of the VCSEL chip exactly on the mirror surface. In addition, the distance between the chip and the substrate is well controlled. However, non-uniform solder deformation can result in squeezing of bonding materials, optical misalignment, a VCSEL aperture damage and electrical shortage. Moreover, non-uniform solder deformation causes weak bonding strength between the chip and the substrate. Thus, there is need for improving the bonding structure between the VCSEL chip and the silicon photonics substrate.

SUMMARY OF THE INVENTION

According to a first aspect of the present invention, there is provided a bonding structure for forming at least one electrical connection between an optoelectronic component and a photonic substrate, the bonding structure comprising: a pillar structure between the optoelectronic component and the photonic substrate, and a bonding layer comprising bonding material on the pillar structure, wherein the pillar structure for at least one individual electrical connection comprises at least two portions and at least one gap between the portions for receiving extra bonding material of the bonding layer.

According to an embodiment, the bonding structure comprises a contact pad on a surface of the photonic substrate.

According to an embodiment, the pillar structure has a predetermined height of 1 to 10 µm.

According to an embodiment, the bonding layer comprises a eutectic alloy.

According to an embodiment, the bonding layer has a bonding area of 250 µm$^2$ to 1 mm$^2$.

According to an embodiment, the gap has a predetermined width of 5 to 100 µm.

According to an embodiment, the bonding structure comprises at least one opening for an optical connection between the optoelectronic component and the photonic substrate.

According to an embodiment, the pillar structure defines a closed path on the surface of the photonic substrate for enclosing a cavity inside the closed path and between the optoelectronic component and the photonic substrate.

According to an embodiment, the at least two portions are connected to each other.

According to an embodiment, the pillar structure (103) comprises at least two separate portions, which are separated from each other by the at least one gap (104).

According to a second aspect of the invention, a VCSEL chip on a silicon photonics substrate comprises the bonding structure.

According to a third aspect of the present invention, there is provided a method for forming at least one electrical connection between an optoelectronic component and a photonic substrate comprising: making a pillar structure on a surface of the photonic substrate; making a first bonding material layer on the pillar structure; making a second bonding material layer on the optoelectronic component; and bonding the first bonding material layer with the second bonding material layer for forming a bonding layer; wherein the pillar structure for at least one individual electrical connection comprises at least two portions and at least one gap between the portions for receiving extra bonding material of the bonding layer.

According to an embodiment, the method comprises making a contact pad on a surface of the photonic substrate.

According to an embodiment, the pillar structure has a predetermined height of 1 to 10 µm.

According to an embodiment, a bonding temperature for bonding the first bonding material layer with the second bonding material layer is lower than a melting temperature of the pillar structure.

According to an embodiment, bonding of the first bonding material layer (112) with the second bonding material layer is provided by eutectic bonding.

According to an embodiment, the method comprises making a seed layer on the contact pad and a photoresist mask on the seed layer.

According to an embodiment, the method comprises making the pillar structure and the first bonding material layer on the pillar structure by electroplating using the photoresist mask.

According to an embodiment, the method comprises removing the photoresist mask and the seed layer after making the first bonding material layer on the pillar structure.

EMBODIMENTS

In the present context, "photonic substrate" is a wafer or a chip comprising photonic functionality. The wafer can be e.g. silicon wafer. The chip can comprise a waveguide.

In the present context, "optoelectronic component" is for example, a vertical-cavity surface-emitting laser (VCSEL) chip, a photodiode or a photodetector.

In the present context, "large bonding area" is bonding area having area of 250 $\mu m^2$ to 1 $mm^2$. In the present context, "height of the pillar structure" is a height of non-deformed material between the photonic substrate and the optoelectronic component. The non-deformed material does not melt or deform during bonding of the photonic substrate and the optoelectronic component by means of the pillar structure.

The object of at least some embodiments is to provide a high quality bonding structure with a relatively large bonding area and good gap control between a photonic substrate and an optoelectronic component.

Figure 1:
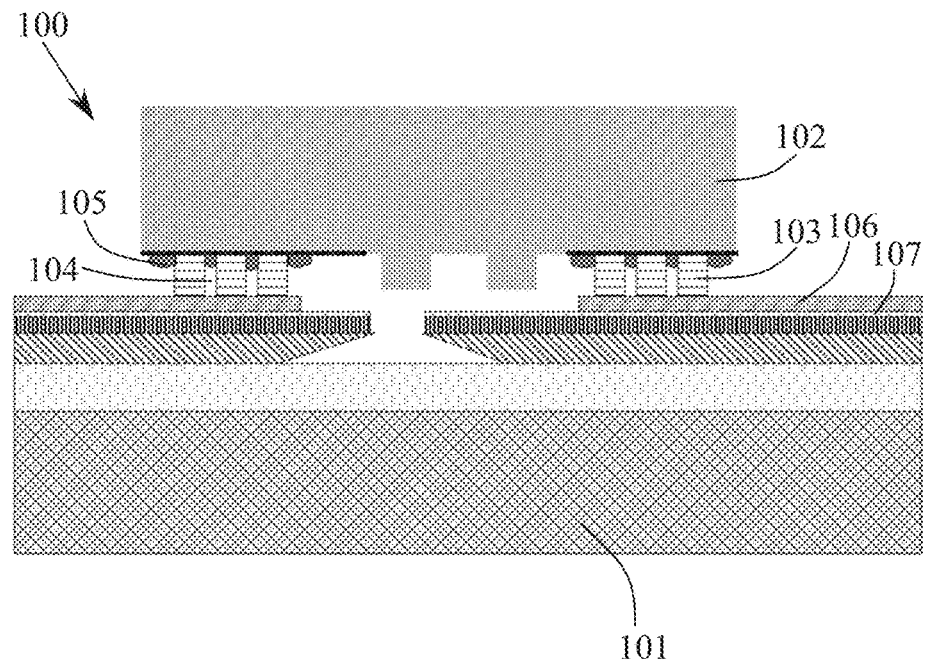
FIG. 1 illustrates a bonding structure in accordance with at least some embodiments of the present invention.

FIG. 1 illustrates a cross-sectional view of a bonding structure 100 for forming at least one electrical connection between an optoelectronic component 102 and a photonic substrate 101 according to an embodiment. The bonding structure 100 comprises a pillar structure 103 between the optoelectronic component 102 and the photonic substrate 101, and a bonding layer 105 comprising bonding material on the pillar structure 103. The pillar structure 103 comprises at least two portions and at least one gap 104 between the portions for receiving extra bonding material of the bonding layer 105. This provides a high quality bonding structure even if there are particles on the photonic substrate and/or the photonic substrate has a high surface roughness. It provides a relatively large bonding area and good gap control between the photonic substrate and the optoelectronic component. The bonding structure also reduces thermal and mechanical stresses inside the structure.

The bonding structure 100 can comprise at least one opening for an optical connection between the optoelectronic component 102 and the photonic substrate 101.

The photonic substrate can comprise silicon. Silicon is very reliable photonic substrate material as it suffers very little fatigue and can have long service lifetimes without breaking. In single crystal form, silicon has virtually no hysteresis and hence almost no energy dissipation The pillar structure 103 can comprise electrically conductive material. The pillar structure 103 can comprise metal or metal alloy which has a melting temperature higher than a temperature of forming of a bonding layer 105. Thus, the pillar structure 103 can comprise for example, nickel and/or copper.

According to some embodiments, the pillar structure 103 has a predetermined height of 1 to 10 $\mu m$. The pillar structure controls a height of a gap between the photonic substrate and the optoelectronic component.

FIG. 1 illustrates that the bonding structure 100 comprises a contact pad 106 on a surface of the photonic substrate 101. The pillar structure 103 is provided on a surface of the contact pad 106. The pillar structure 103 covers the surface of the contact pad 106 partially. The at least one electrical connection between an optoelectronic component 102 and a photonic substrate 101 is formed via the contact pad 106, the pillar structure 103 and the bonding layer 105.

The contact pad 106 can comprise electrically conductive material. The contact pad 106 can comprise metal, such as gold, molybdenum, aluminum or copper. These metals enable good and reliable electrical connection.

FIG. 1 illustrates that the photonic substrate 101 comprises a passivation layer 107 on the surface of the photonic substrate 101. Then, the contact pad 106 can be provided on a surface of the passivation layer 107.

The passivation layer 107 can comprise silicon dioxide ($SiO_2$), aluminum oxide ($Al_2O_3$) or aluminum nitride (AlN), for instance. The passivation layers prevent short-circuiting.

According to some embodiments, the bonding layer 105 comprises a eutectic alloy. The eutectic alloy can comprise two or more metals. Suitable eutectic alloys include, for example, germanium-aluminum, gold-tin, gold-germanium, gold-silicon, gold-indium or copper-tin alloy. Eutectic alloy produces a strong and hermetic bond between the photonic substrate and the optoelectronic component.

A thickness of the bonding layer 105 can be 1 to 10 $\mu m$. This provides a high quality bond between the optoelectronic component and the photonic substrate even if there are particles on the bonding surfaces.

Figure 2:
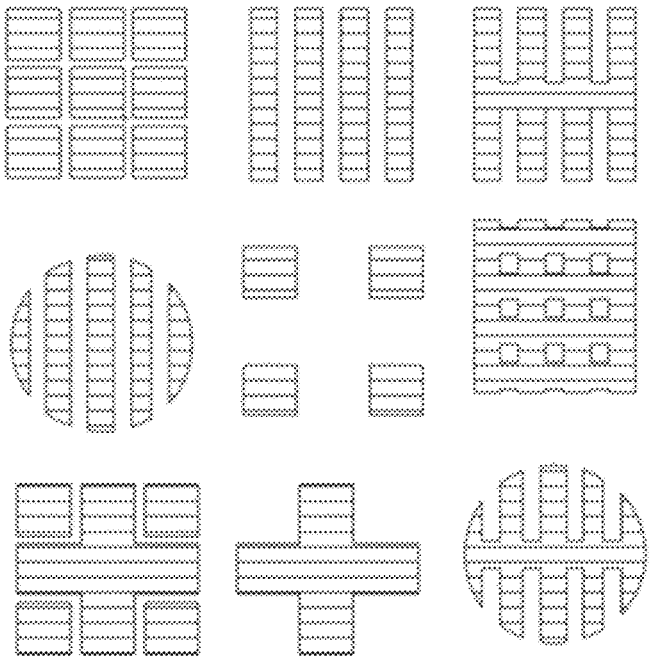
FIG. 2 illustrates a top view of a pillar structure embodiments in accordance with at least some embodiments of the present invention.

FIG. 2 illustrates a top view of alternatives of the pillar structure 103. The pillar structure 103 comprises at least two portions and at least one gap 104 between the portions. The at least two portions can be connected to each other or unconnected such that they are separated from each other by a distance. The pillar structure can comprise at least two branches which form the portions of the pillar structure and leave a gap in between the branches. The branches can be connected together at one end, for instance. The at least gap can also be formed inside an outline of the pillar structure 103. In other words, the at least one gap can by formed by at least one cavity or hole inside the outline of the pillar structure 103. It is also possible that the pillar structure comprises at least two portions which are separated by the at least one gap.

The gap 104 can have a predetermined width of at least 1 $\mu m$. The predetermined width of the gap 104 can be 5 to 100 $\mu m$, for example. This provides a sufficient wide gap, which ensures that the extra bonding material of the bonding layer can flow between the portions of the pillar structure.

The pillar structure 103 can surround the surface of the photonic substrate 101 for enclosing a cavity inside the pillar structure 103. This enables hermetic packaging, which ensures the long-term stability and increases the reliability and the lifetime of the bonding structure.

According to some embodiments, a method for forming at least one electrical connection between an optoelectronic component 102 and a photonic substrate 101 comprises making a pillar structure 103 on a surface of the photonic substrate 101, making a first bonding material layer 112 on the pillar structure 103, making a second bonding material layer 113 on the optoelectronic component 102, and bonding the first bonding material layer 112 with the second bonding material layer 113 for forming a bonding layer 105. The pillar structure 103 for at least one individual electrical connection comprises at least two portions and at least one gap 104 between the portions for receiving extra bonding material of the bonding layer 105. The method provides a simple and cost effective process for forming the bonding structure 100. The method provides a high quality bonding structure even if there are particles on the substrate and/or the substrate has a high surface roughness. It provides a large bonding area and a good gap control between the photonic substrate and the optoelectronic component. The method also reduces thermal and mechanical stresses inside the structure. The method provides high alignment accuracy between a VCSEL, a photodiode or a photodetector and a silicon photonic substrate.

According to some embodiments, the method comprises making a contact pad 106 on a surface of the photonic substrate 101. Then, the pillar structure 103 is made on a surface of the contact pad 106.

The method for forming at least one electrical connection between the optoelectronic component 102 and the photonic substrate 101 will now be discussed in more detail by means of example embodiments.

Figure 3:
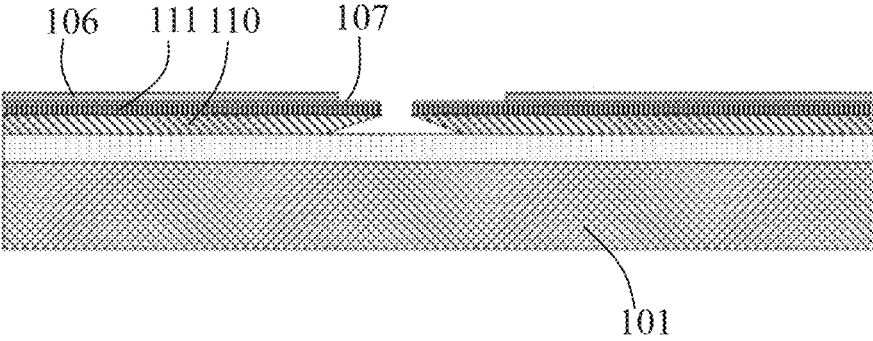
FIG. 3 illustrates making of a contact pad on a surface of a passivation layer in accordance with at least some embodiments of the present invention.

FIG. 3 illustrates that the photonic substrate 101 comprises a silicon waveguide 110 on the surface of the photonic substrate. An anti-reflective (AR) coating 111 is formed on the surface of the waveguide. The AR coating help to reduce image distortions associated with reflections off the surface of the photonic substrate.

FIG. 3 illustrates that a passivation layer 107 is formed on a surface of the anti-reflective coating 111. The passivation layer can be grown, for example, by thermal oxidation in which a layer is exposed to oxygen and/or steam to grow a thin surface layer on the layer.

FIG. 3 illustrates that the contact pad 106 is made on a surface of passivation layer 107. The contact pad provides an electrical connection between the photonic substrate 101 and the optoelectronic component 102 and between the structure 100 and an electrical circuit outside the structure 100.

Figure 4:
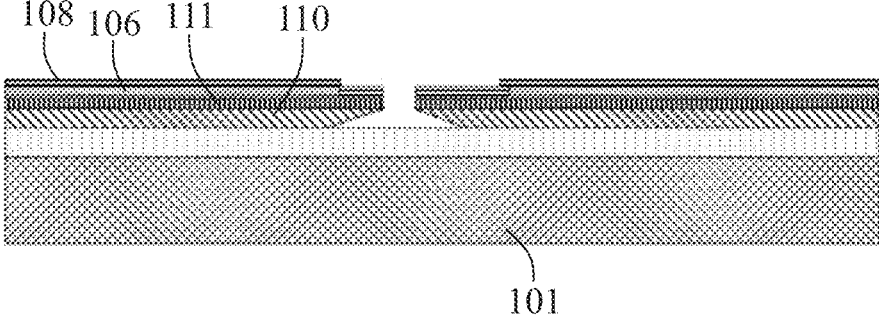
FIG. 4 illustrates making a seed layer on a contact pad in accordance with at least some embodiments of the present invention.

FIG. 4 illustrates that the method comprises making a seed layer 108 on the contact pad 106. The seed layer 108 can be sputtered or electroplated. The seed layer 108 can comprise metal or metal alloy, such as titanium-tungsten (TiW) or titanium-copper (TiCu) alloy. The seed layer 108 provides good adhesion to the photonic substrate for layers provided on the seed layer.

Figure 5:
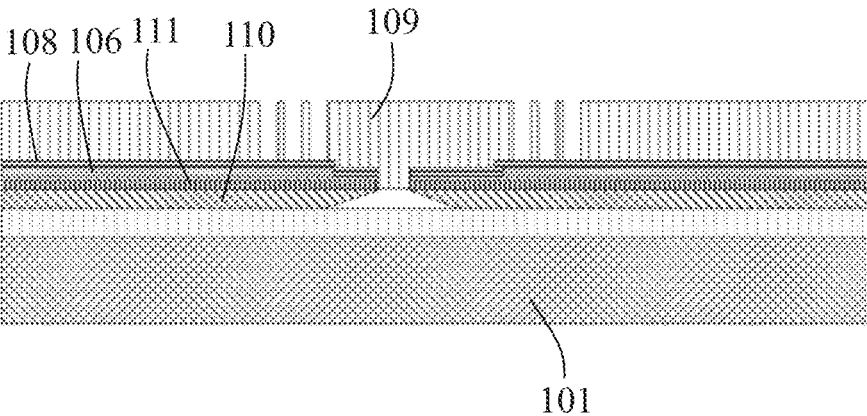
FIG. 5 illustrates making a photoresist mask on a seed layer in accordance with at least some embodiments of the present invention.

FIG. 5 illustrates that the method comprises making a photoresist mask 109 on the seed layer 108. The photoresist mask 109 can be made by photolithography. The mask 109 can comprise polymer, such as epoxy-based polymer or off-stoichiometry thiol-ene (OSTE) polymer.

The photoresist mask 109 is patterned. Thus, the mask 109 is removed from the pillar structure 103 areas, so that only unmasked regions of the surface will be exposed to further processing to form a coating on these regions. The patterned mask 109 enables producing of the pillar structure 103 having different patterns on the photonic substrate 101.

Figure 6:
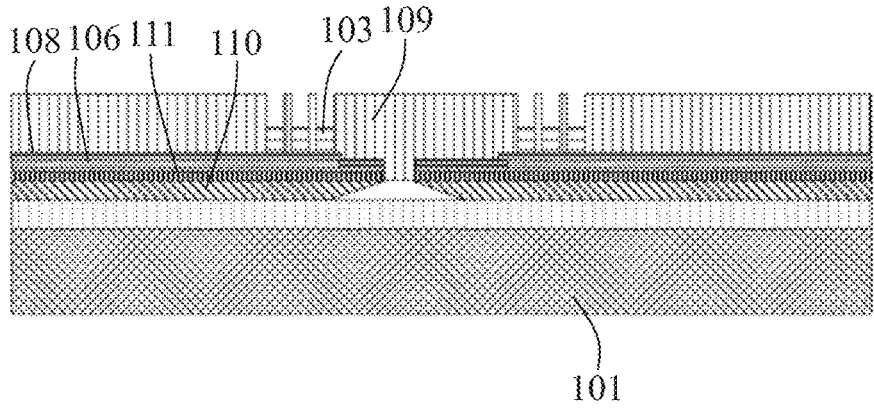
FIG. 6 illustrates making a pillar structure on a seed layer in accordance with at least some embodiments of the present invention.

FIG. 6 illustrates that the method comprises making the pillar structure 103 on a surface of the seed layer 108. The pillar structure 103 is made by electroplating in the openings in the photoresist mask 109. An electrolyte used for nickel electroplating can comprise nickel sulfate (NiSO$_4$·6H$_2$O), nickel chloride (NiCl$_2$·6H$_2$O) and boric acid H$_3$BO$_3$. In the final structure, the pillar structure 103 controls the distance between the photonic substrate 101 and the optoelectronic component 102. The gap 104 receives extra bonding material of the bonding layer 105 due to used excessive bonding material or volumetric expansion of the bonding material during the bonding of the photonic substrate 101 and the optoelectronic component 102.

Figure 7:
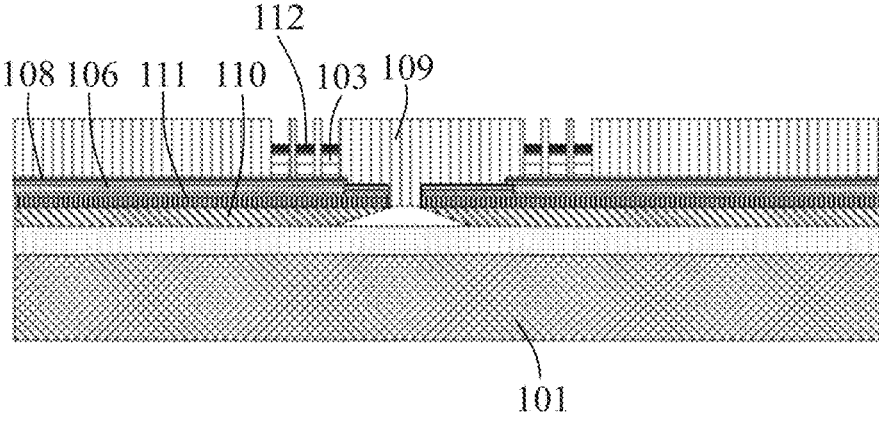
FIG. 7 illustrates making a first bonding material layer on a pillar structure in accordance with at least some embodiments of the present invention.

FIG. 7 illustrates that the method comprises making the first bonding material layer 112 on the pillar structure 103. The first bonding material layer 112 is made by electroplating in the openings in the photoresist mask 109. Thus, the pillar structure 103 and the first bonding material layer 112 can be formed using the same mask 109. This makes the method simple and cost effective.

The first bonding material layer 112 can comprise for example tin (Sn). An electrolyte used for tin electroplating can comprise for example, sulphuric acid tin(ll)-sulphate or methane sulphonic acid (CH$_3$SO$_3$H) and its salt, tin(ll)-methane sulphonate.

Figure 8:
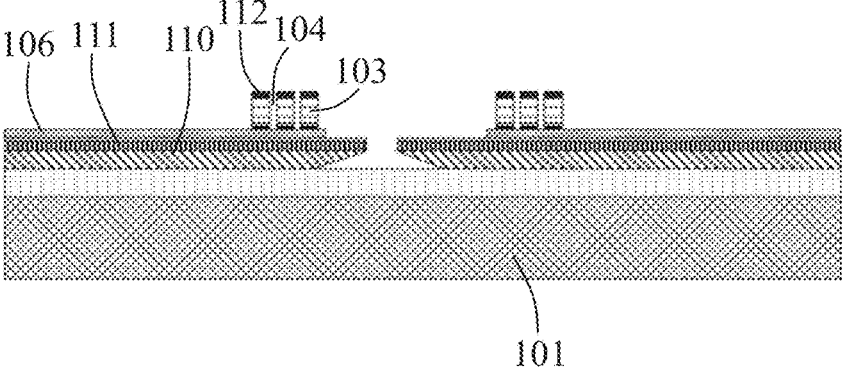
FIG. 8 illustrates removing a photoresist mask and a seed layer in accordance with at least some embodiments of the present invention.

FIG. 8 illustrates that the method comprises removing the photoresist mask 109 and the seed layer 108 after making the first bonding material layer 112 on the pillar structure 103. The seed layer 108 and the photoresist mask 109 can be dissolved.

Figure 9:
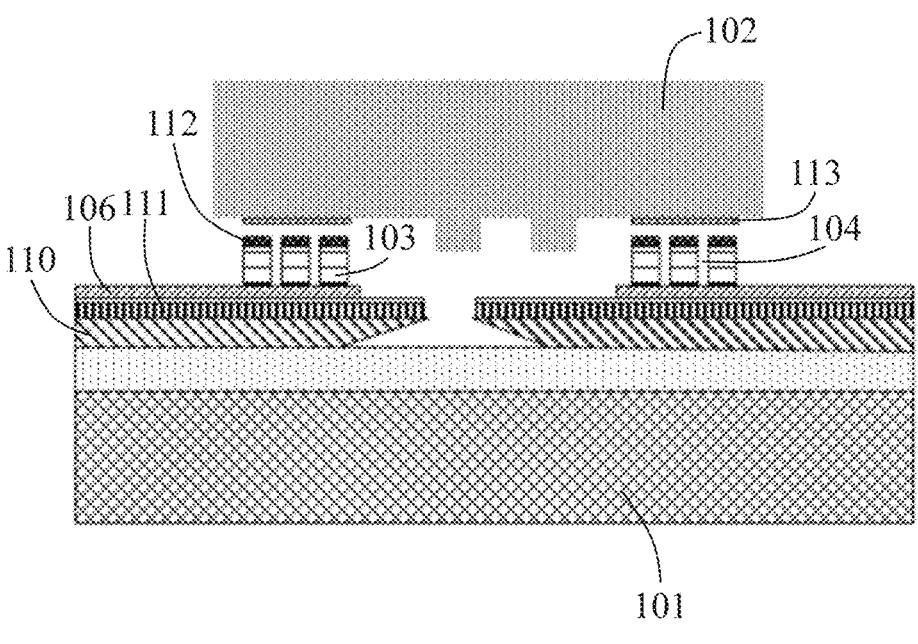
FIG. 9 illustrates making a second bonding material layer on an optoelectronic component in accordance with at least some embodiments of the present invention.

FIG. 9 illustrates that the second bonding material layer 113 is made on the optoelectronic component 102. The second bonding material layer 113 can be formed by electroplating, for instance.

The second bonding material layer 113 can comprise for example, copper (Cu) or gold (Au).

According to some embodiments, a bonding temperature for bonding the first bonding material layer 112 with the second bonding material layer 113 is lower than a melting temperature of the pillar structure 103. The bonding temperature can be for example, at least 500° C., preferably 500-1200° C., lower than the melting temperature of the pillar structure 103. Thus, the pillar structure 103 is not deformed or melted during the bonding. The pillar structure ensures that the photonic substrate 101 and the optoelectronic component 102 are separated by the gap between photonic substrate 101 and the optoelectronic component 102 during the bonding. In addition, a height of the gap can be adjusted by the height of the pillar structure. Thus, the pillar structure provides good gap control between the photonic substrate and the optoelectronic component.

Bonding of the first bonding material layer 112 with the second bonding material layer 113 can be provided by metal bonding, such as eutectic bonding, solder bonding or solid-liquid interdiffusion (SLID) bonding.

According to some embodiments, bonding of the first bonding material layer 112 with the second bonding material layer 113 is provided by eutectic bonding. Eutectic bonding does not require use of high contact force during the bonding. Eutectic bonding is less sensitive to surface flatness irregularities, scratches, as well as to particles compared to the direct wafer bonding methods, because the eutectic bonding process goes through a liquid phase.

In eutectic bonding, temperature can be raised to a value lower than the eutectic temperature of the eutectic alloy. Then, temperature can be maintained constant for short time to reach uniform heating of both the photonic substrate and the optoelectronic component. After that, temperature can be increased to a temperature exceeding the eutectic point. Finally, the structure can cool down to a temperature below the eutectic temperature.

Eutectic bonding can be conducted 10-20° C. above eutectic temperature of a eutectic alloy. Aluminum-germanium bonding can be conducted for example, at 390° C. Gold-tin bonding can be conducted for example, at 290° C. Gold-silicon bonding can be conducted for example, at 375° C. Gold-germanium bonding can be conducted for example, at 435° C.

Bonding can be conducted in a bonding chamber. A controlled vacuum pressure can be formed in the bonding chamber. The vacuum pressure can be for example, 0.8 10$^{-5}$ mbar. One or more inert gases, such as argon and nitrogen, can be introduced to the bonding chamber.

The bonding structure can be used to bond a chip to a chip, a chip to a wafer, or a wafer to wafer. The bonding structure can be used to bond VCSEL, a photodiode, a photodetector on a silicon photonics substrate.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

REFERENCE SIGNS LIST 100 bonding structure
101 photonic substrate 102 optoelectronic component
103 pillar structure
104 gap
105 bonding layer
106 contact pad
107 passivation layer
108 seed layer
109 photoresist (PR) mask
110 waveguide
112 first bonding material layer
113 second bonding material layer

The invention claimed is:

1. A bonding structure for forming at least one electrical connection between an optoelectronic component and a photonic substrate, the bonding structure comprising:
   a pillar structure between the optoelectronic component and the photonic substrate, and
   a bonding layer comprising bonding material on the pillar structure,
wherein the pillar structure for at least one individual electrical connection comprises at least two portions and at least one gap between the portions for receiving extra bonding material of the bonding layer,
wherein the bonding layer comprises a eutectic alloy and has a thickness of 1 to 10 µm, and
wherein the bonding structure allows an optical connection between the optoelectronic component and the photonic substrate.

2. The bonding structure of claim 1, wherein the bonding structure comprises a contact pad on a surface of the photonic substrate.

3. The bonding structure of claim 1, wherein the pillar structure has a predetermined height of 1 to 10 µm.

4. The bonding structure of claim 1, wherein the bonding layer has a bonding area of 250 µm² to 1 mm².

5. The bonding structure of claim 1, wherein the gap has a predetermined width of 5 to 100 µm.

6. The bonding structure of claim 1, wherein the pillar structure defines a closed path on the surface of the photonic substrate for enclosing a cavity inside the closed path and between the optoelectronic component and the photonic substrate.

7. A VCSEL chip on a silicon photonics substrate comprising the bonding structure of claim 1.

8. The bonding structure according to claim 1, further comprising a passivation layer on a surface of the photonic substrate.

9. A method for forming at least one electrical connection between an optoelectronic component and a photonic substrate comprising:
   making a pillar structure on a surface of the photonic substrate;
   making a first bonding material layer on the pillar structure;
   making a second bonding material layer on the optoelectronic component; and
   bonding the first bonding material layer with the second bonding material layer for forming a bonding layer;
   wherein the pillar structure for at least one individual electrical connection comprises at least two portions and at least one gap between the portions for receiving extra bonding material of the bonding layer,
   wherein bonding of the first bonding material layer with the second bonding material layer is provided by eutectic bonding, and wherein an optical connection between the optoelectronic component and the photonic substrate is present after the bonding step.

10. The method of claim 9, wherein the method comprises making a contact pad on a surface of the photonic substrate.

11. The method of claim 9, wherein the pillar structure has a predetermined height of 1 to 10 µm.

12. The method of claim 9, wherein a bonding temperature for bonding the first bonding material layer with the second bonding material layer is lower than a melting temperature of the pillar structure.

13. The method of claim 9, wherein the method comprises making a seed layer on the contact pad and a photoresist mask on the seed layer.

14. The method of claim 13, wherein the method comprises making the pillar structure and the first bonding material layer on the pillar structure by electroplating using the photoresist mask.

15. The method of claim 13, wherein the method comprises removing the photoresist mask and the seed layer after making the first bonding material layer on the pillar structure.

16. A bonding structure for forming at least one electrical connection between an optoelectronic component and a photonic substrate, the bonding structure comprising:

a pillar structure between the optoelectronic component and the photonic substrate, and a bonding layer comprising bonding material on the pillar structure, wherein the pillar structure for at least one individual electrical connection comprises at least two portions and at least one gap between the portions for receiving extra bonding material of the bonding layer, wherein the bonding layer comprises a eutectic alloy and has a thickness of 1 to 10 µm, and wherein the pillar structure defines a closed path on the surface of the photonic substrate for enclosing a cavity inside the closed path and between the optoelectronic component and the photonic substrate.

* * * * *